United States Patent
Kim

(10) Patent No.: US 7,781,318 B2
(45) Date of Patent: Aug. 24, 2010

(54) SEMICONDUCTOR DEVICE AND METHOD OF MANUFACTURING THE SAME

(75) Inventor: Jae Hong Kim, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 262 days.

(21) Appl. No.: 11/930,341

(22) Filed: Oct. 31, 2007

(65) Prior Publication Data

US 2008/0150139 A1  Jun. 26, 2008

(30) Foreign Application Priority Data

Dec. 21, 2006 (KR) .................. 10-2006-0132234

(51) Int. Cl.
  *H01L 21/20* (2006.01)
  *H01L 21/44* (2006.01)
  *H01L 21/4763* (2006.01)
(52) U.S. Cl. ............... 438/584; 438/597; 438/643; 438/658; 438/686; 438/687; 257/E21.576; 257/E21.582; 257/E21.591
(58) Field of Classification Search .......... 257/E21.576, 257/E21.582, E21.591
  See application file for complete search history.

(56) References Cited

U.S. PATENT DOCUMENTS

| | | | | |
|---|---|---|---|---|
| 3,841,983 A | * | 10/1974 | Itai et al. ........... | 205/709 |
| 5,939,334 A | * | 8/1999 | Nguyen et al. ........... | 438/689 |
| 6,921,712 B2 | * | 7/2005 | Soininen et al. .......... | 438/597 |
| 6,953,946 B2 | * | 10/2005 | Yoo et al. ............... | 257/10 |
| 2004/0224500 A1 | * | 11/2004 | Cho ......................... | 438/643 |
| 2005/0206000 A1 | * | 9/2005 | Aggarwal et al. ........ | 257/758 |

FOREIGN PATENT DOCUMENTS

| KR | 10-2005-7007676 | 7/2005 |
|---|---|---|
| KR | 10-2004-0109371 | 6/2006 |
| KR | 10-2004-0111040 | 6/2006 |
| KR | 10-2004-0113069 | 7/2006 |

* cited by examiner

*Primary Examiner*—Charles D Garber
*Assistant Examiner*—Mohsen Ahmadi
(74) *Attorney, Agent, or Firm*—Saliwanchik, Lloyd & Saliwanchik

(57) ABSTRACT

Disclosed are a semiconductor device and a method for manufacturing the same, capable of improving the performance of a barrier and inhibiting a discontinuous step coverage and an overhang. The semiconductor device includes an interlayer dielectric layer having a via hole disposed on a semiconductor substrate, a first layer disposed in the via hole and including ruthenium (Ru), a second layer disposed on the first layer and including ruthenium oxide ($RuO_2$), and a metal line disposed on the second layer and including a copper material.

7 Claims, 5 Drawing Sheets

SEMICONDUCTOR DEVICE AND METHOD OF MANUFACTURING THE SAME

CROSS-REFERENCE TO RELATED APPLICATION

The present application claims the benefit under 35 U.S.C. §119 of Korean Patent Application No. 10-2006-0132234, filed Dec. 21, 2006, which is hereby incorporated by reference in its entirety.

BACKGROUND

In order to highly integrate a semiconductor device and to obtain high performance of the semiconductor device, a metal line having a multi-layer structure has been widely used. Although aluminum (Al) is widely used for the metal line, recently, copper (Cu) having superior conductivity has been substituted for aluminum (Al).

However, since a copper line layer is not easily patterned, the copper line layer is mainly formed through a damascene process and a chemical mechanical polishing (CMP) process.

FIGS. 1A to 1B are cross-sectional views showing a method for manufacturing a related semiconductor device.

Referring to FIG. 1A, an interlayer dielectric layer 110 is formed on a semiconductor substrate 100. A via hole 113 is formed in the interlayer dielectric layer 110 through a damascene process.

A barrier layer 120 is formed on the interlayer dielectric layer 110 including the via hole 113 to block the diffusion of copper (Cu).

A seed layer 130 is formed on the barrier layer 120 to enable copper (Cu) to be easily deposited. The seed layer 130 may be formed through a physical vapor deposition (PVD) process.

When the seed layer 130 is formed through the PVD process, the seed layer 130 becomes relatively thicker at an inlet of the via hole 113, that is, at a corner area 133 of an upper portion of the via hole 113, so that an overhang may be formed. Accordingly, the seed layer 130 is not easily formed on the barrier layer 120 at the side surface of the via hole 113 due to the overhang. Accordingly, an area in which the seed layer 130 is not formed on the barrier layer 120 at the side surface of the via hole 113, that is, a discontinuous step coverage area 136 exists.

Since the seed layer 130 does not exist in the discontinuous step coverage area 136, the copper material may not be easily deposited in the discontinuous step coverage area 136 when the copper material is buried in the following process.

Referring to FIG. 1B, a copper layer 140 is formed on the seed layer 130 including the via hole 113.

In this case, although the copper layer 140 is not sufficiently formed at the side surface of the via hole 113 due to the overhang, the copper layer 140 is easily formed on the bottom surface of the via hole 113. Accordingly, a void 143 or a long seam may be created in the copper layer 140 of the via hole 113.

Meanwhile, recently, as the line width of a metal line is reduced, the barrier layer 120 and the seed layer 130 gradually become thinner.

However, as the barrier layer 120 becomes thinner, the performance of the barrier layer may be degraded.

In addition, as the seed layer 130 becomes thinner, the discontinuous step coverage frequently occurs, so that the probability of creating the void is increased.

Thus, there exists a need in the art for an improved metal line for a semiconductor device.

BRIEF SUMMARY

Embodiments of the present invention provide a semiconductor device and a method for manufacturing the same, capable of improving the performance of a barrier of a metal line.

An embodiment of the present invention also provides a semiconductor device and a method for manufacturing the same, capable of inhibiting a void from being created by forming a continuous step coverage and restricting an overhang.

According to an embodiment, a semiconductor device includes an interlayer dielectric layer disposed on a semiconductor substrate and having a via hole, a first layer disposed in the via hole and including ruthenium (Ru), a second layer disposed on the first layer and including ruthenium oxide ($RuO_2$), and a metal line disposed on the second layer and including a copper material.

According to an embodiment, a method for manufacturing a semiconductor device includes forming an interlayer dielectric layer on a semiconductor substrate, wherein the interlayer dielectric layer has a via hole, forming a first layer on the interlayer dielectric layer including the via hole using a ruthenium material, forming a second layer on the first layer through an anodizing process, wherein the second layer includes ruthenium oxide ($RuO_2$), forming a copper layer on the second layer using the second layer as a seed layer, and forming a metal line in the via hole from the copper layer.

DETAILED DESCRIPTION

Hereinafter, embodiments of the present invention will be described in detail with reference to accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1A:
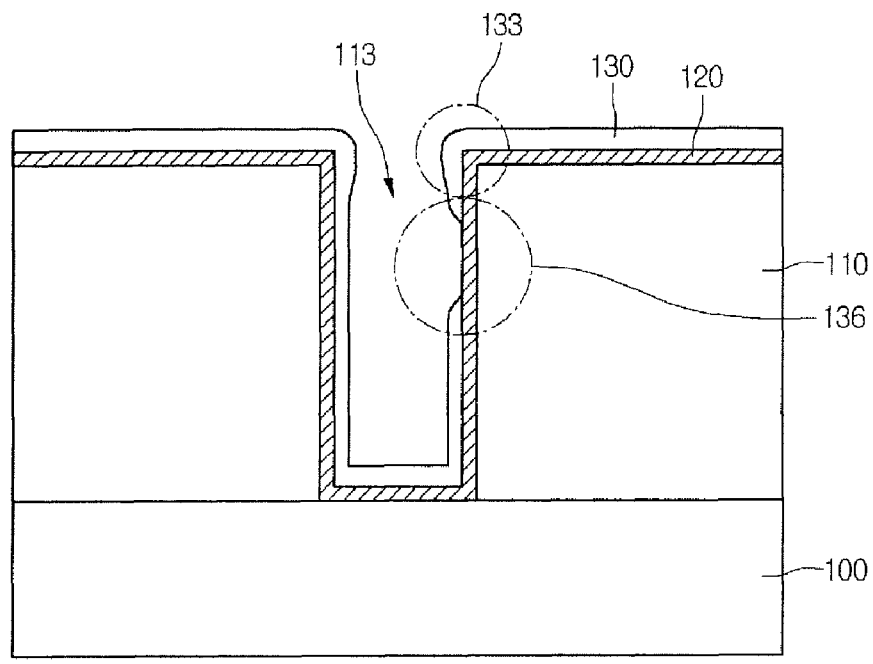
FIGS. 1A and 1B are cross-sectional views showing a manufacturing process of a related semiconductor device.
Figure 1B:
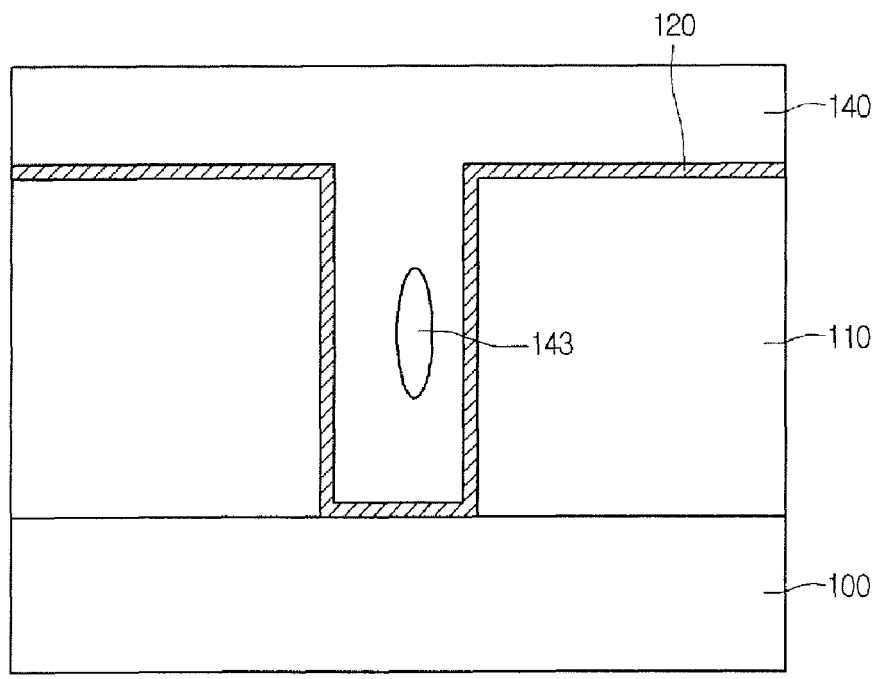
Figure 2:
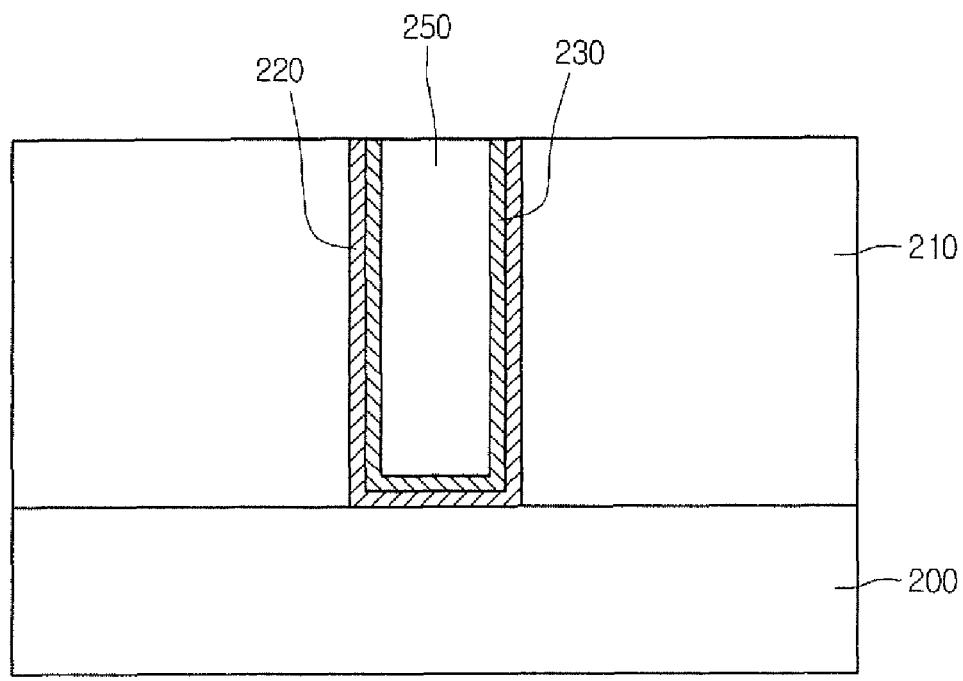
FIG. 2 is a cross-sectional view showing a semiconductor device according to an embodiment of the present invention.

Referring to FIG. 2, a semiconductor device can include an interlayer dielectric layer 210 with a via hole provided on a semiconductor substrate 200.

A first layer 220 can be provided in the via hole of the interlayer dielectric layer 210. The first layer 220 can include ruthenium (Ru). The first layer 220 may have the thickness in the range of about 100 Å to about 800 Å. The first layer 220 can have a barrier characteristic to inhibit copper (Cu) from being diffused into the interlayer dielectric layer 210.

A second layer 230 can be provided on the first layer 220. The second layer 230 may have a thickness in the range of about 50 Å to about 200 Å. The second layer 230 can include ruthenium oxide ($RuO_2$). The ruthenium (Ru) of the first layer 220 can be reacted with a hydroxyl radical (OH) solution, so that the second layer 230 can be directly formed from the first layer 220. Ruthenium oxide ($RuO_2$) has a conductivity of about 36 Ω-cm, and can sufficiently serve as a seed layer to form a metal line including copper (Cu).

According to an embodiment, the first layer 220 including ruthenium (Ru) is used as a barrier layer, and the second layer 230 including ruthenium oxide ($RuO_2$) may be used as a seed layer to form a metal line including copper (Cu).

Accordingly, since an overhang is not created in a corner area provided at an upper portion of the via hole, a void or a seam is not created in a metal line when the metal line is formed.

In addition, since the overhang is not created in the corner area provided at the upper portion of the via hole, the second layer 230 provided below the corner area at the side surface of the via hole has a continuous step coverage.

Further, the diffusion of copper (Cu) can be blocked by the first and second layers 220 and 230, so that the performance of the barrier can be improved.

A metal line 250 including a copper material can be provided on the second layer 230 in the via hole.

FIGS. 3A to 3F are cross-sectional views showing a manufacturing process of a semiconductor device according to an embodiment.

Figure 3A:
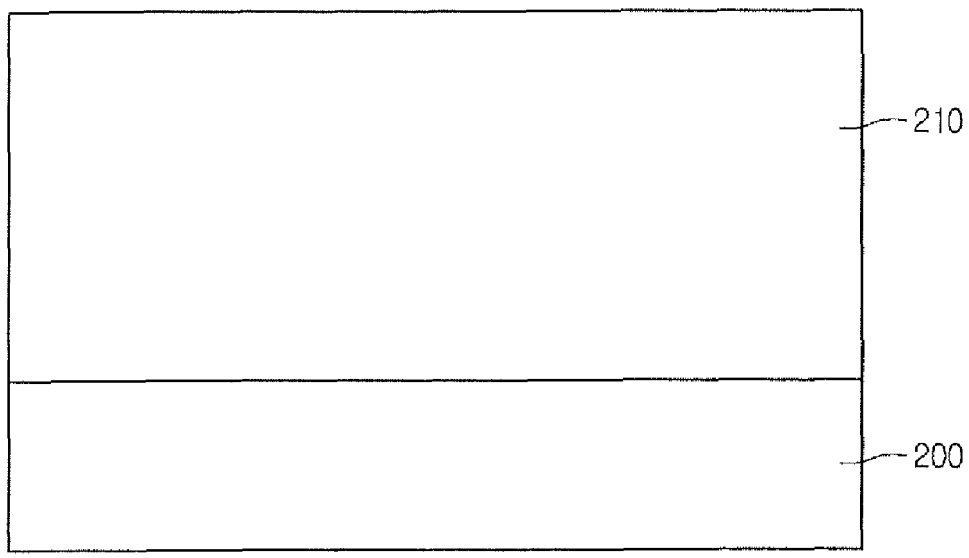
FIGS. 3A to 3F are cross-sectional views showing a manufacturing process of a semiconductor device according to an embodiment of the present invention.

Referring to FIG. 3A, an interlayer dielectric layer 210 can be formed on a semiconductor substrate 200. The semiconductor substrate can include predetermined structures including, but not limited to a conductive device (e.g., a line), a driving device (e.g., transistor), or a capacitor. The interlayer dielectric layer 210 can be formed of, for example, boron silicate glass (BSG), boron phosphorous silicate glass (BPSG), or undoped silicate glass (USG).

The interlayer dielectric layer 210 can be formed through, for example, a physical vapor deposition (PVD) process.

Figure 3B:
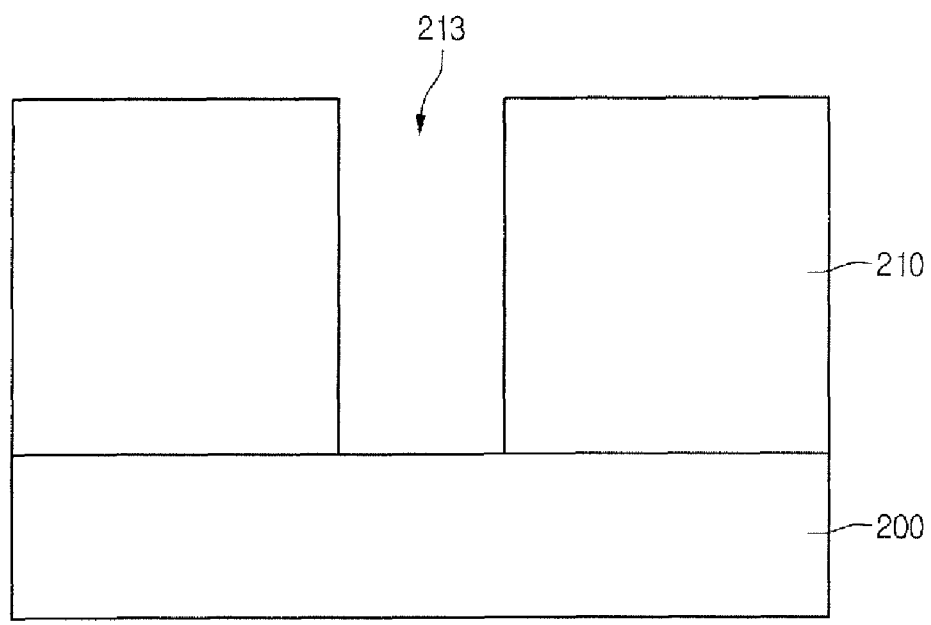

Referring to FIG. 3B, the interlayer dielectric layer 210 can be patterned to form a via hole 213. The via hole 213 may be formed such that a structure or region on the semiconductor substrate 200 is exposed. For example, the via hole 213 may be formed such that a conductive device, a driving device, or a capacitor formed on the semiconductor substrate 200 is exposed.

Figure 3C:
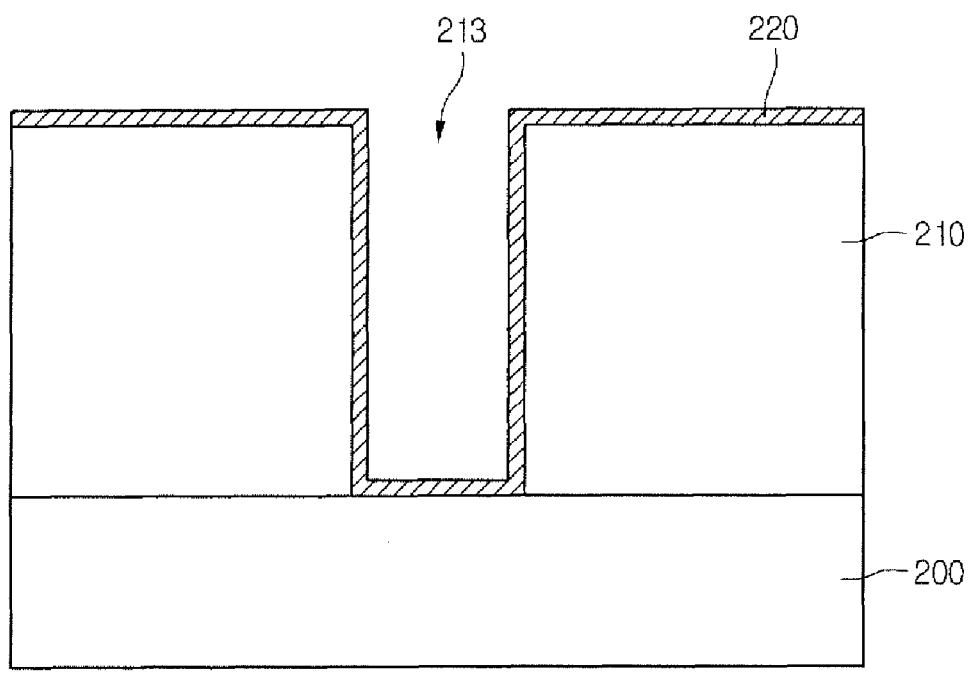

Referring to FIG. 3C, a ruthenium (Ru) material can be deposited on the interlayer dielectric layer 210 including the via hole 213 to form a first layer 220.

The first layer 220 may be formed through, for example, a PVD process or an atomic layer deposition (ALD) process. The PVD process can include a sputtering process, an e-beam evaporation process, a thermal evaporation process, a laser molecular beam epitaxy (L-MBE) process, or a pulse laser deposition (PLD) process.

It is preferred that the first layer 220 is as thin as possible while maintaining a barrier characteristic of inhibiting copper (Cu) from being diffused. Accordingly, in one embodiment, the first layer 220 may have a thickness in the range of about 100 Å to about 800 Å.

Figure 3D:
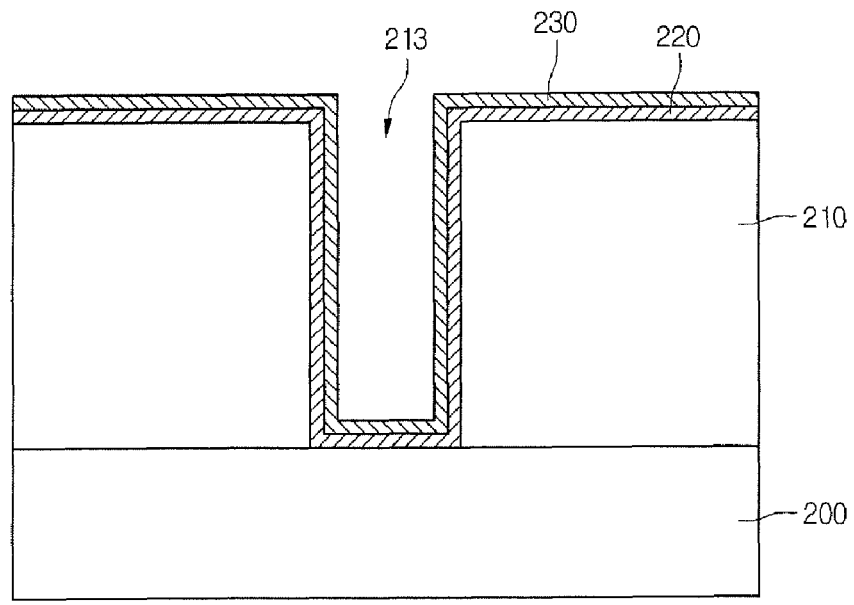

Referring to FIG. 3D, an anodizing process can be performed with respect to the first layer 220, thereby forming the second layer 230 including ruthenium oxide ($RuO_2$) on the first layer 220.

The anodizing process can include immersing the semiconductor substrate 200 in a hydroxyl radical (OH) solution, and applying an anode current to the first layer 220 including ruthenium (Ru). The ruthenium (Ru) reacts with the hydroxyl radical (OH) solution by the anode current, thereby forming ruthenium oxide ($RuO_2$). Ruthenium oxide ($RuO_2$) can be continuously formed to from the second layer 230.

In an embodiment, the anode current has an intensity in the range of about 0.5 A to about 2 A.

The second layer 230 may have a thickness in the range of about 50 Å to about 200 Å in order to serve as a seed layer to form a metal line including copper (Cu). Ruthenium oxide ($RuO_2$) has a conductivity of about 36 Ω-cm and can sufficiently serve as a seed layer of copper (Cu).

As described above, the second layer 230 is formed through an anodizing process to serve as a seed layer for forming a metal line including copper (Cu). Accordingly, an overhang can be inhibited from being created at a corner area in the upper portion of the via hole 213. In addition, the second layer 230 can be uniformly formed on the first layer 220 through an anodizing process, so that the second layer 230 may have a continuous step coverage.

In addition, a double layer including the first and second layers 230 can sufficiently serve as a barrier to inhibit copper (Cu) from being diffused, so that a barrier characteristic can be improved.

Figure 3E:
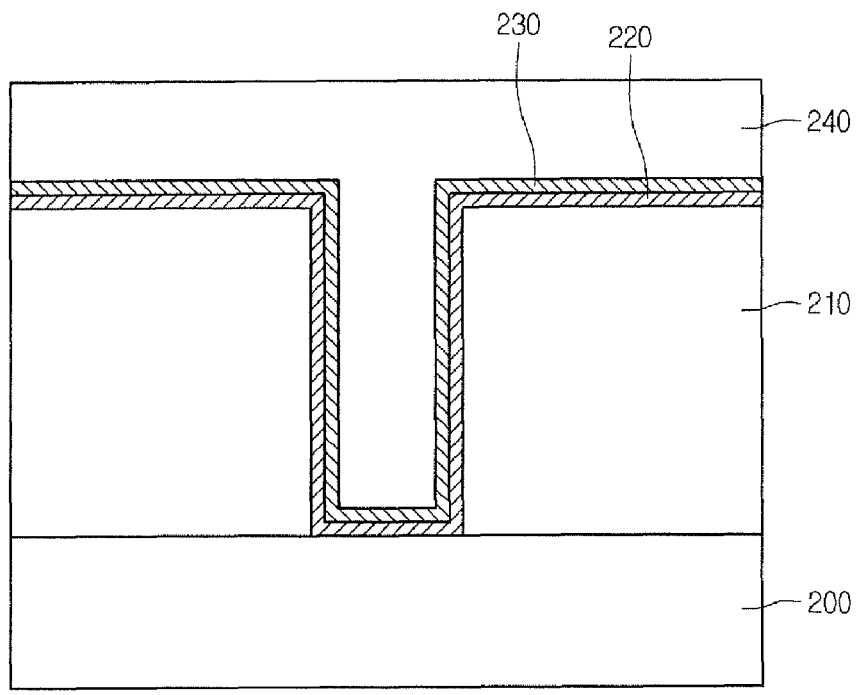

Referring to FIG. 3E, a copper layer 240 can be formed on the second layer 230 through an electrochemical plating (ECP) process by employing the second layer 230 as a seed layer.

Figure 3F:
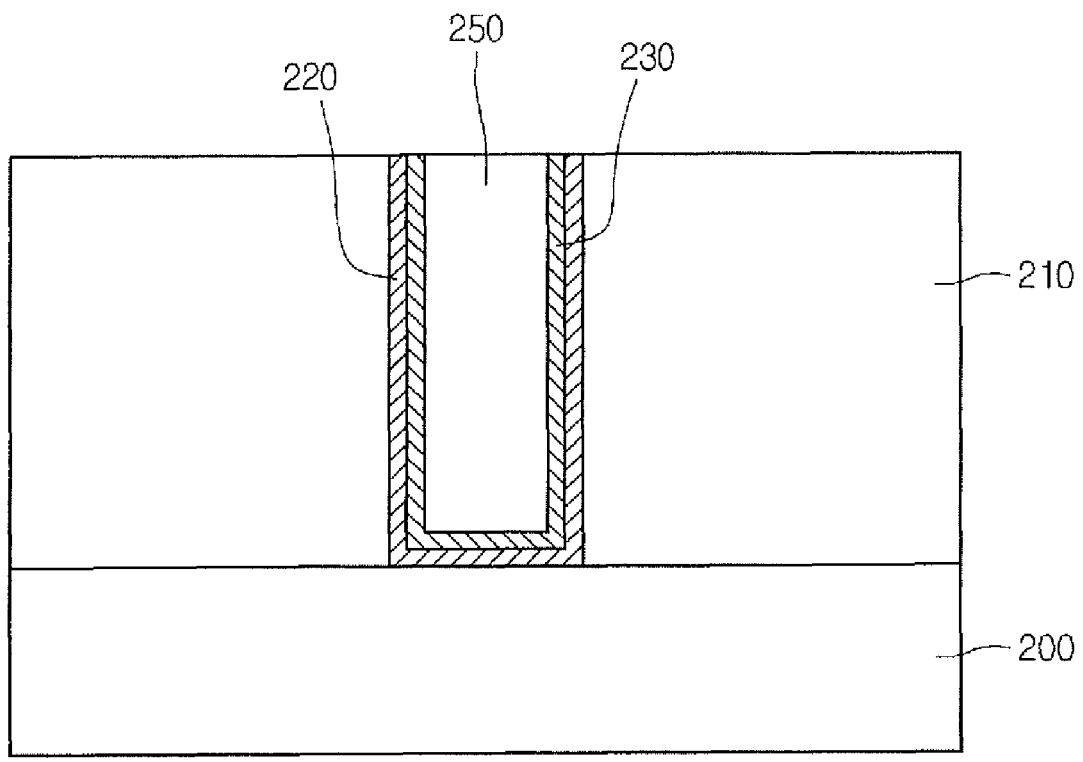

Referring to FIG. 3F, a (Chemical Mechanical Polishing) CMP process can be performed in order to remove the first layer 220, the second layer 230, and the copper layer 240 from the interlayer dielectric layer 210 except for at the via hole, thereby forming the metal line 250 in the via hole 213 of the interlayer dielectric layer 210. Although embodiments have been described with respect to a via hole 213, a trench can also be provided in contact with the via hole 213 in the interlayer dielectric layer 210 for the metal line 250.

Accordingly, an overhang or a discontinuous step coverage is not created on the second layer 230 serving as a seed layer, so that a void or a seam is not created in the metal line 250 when the metal line 250 is formed. Therefore, gap-fill performance can be improved.

As described above, according to an embodiment, ruthenium oxide ($RuO_2$) is formed using ruthenium, thereby inhibiting an overhang or a discontinuous step coverage from being created.

According to embodiments of the present invention, the creation of the overhang or the discontinuous step coverage is restricted, thereby inhibiting a void or a seam from being created in the metal line.

According to an embodiment, the diffusion of copper (Cu) is inhibited by a double layer including ruthenium (Ru) and ruthenium oxide ($RuO_2$), so that the characteristic of a barrier can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, comprising:

forming an interlayer dielectric layer comprising a via hole on a semiconductor substrate;

forming a first layer on the interlayer dielectric layer including the via hole using a ruthenium material;

forming a second layer directly on the first layer through an anodizing process, wherein the second layer comprises ruthenium oxide ($RuO_2$);

forming a copper layer on the second layer using the second layer as a seed layer; and forming a metal line in the via hole using the copper layer, wherein forming the second layer directly on the first layer through the anodizing process comprises performing the anodizing process with respect to the first layer, wherein forming the second layer directly on the first layer through the anodizing process comprises reacting the ruthenium (Ru) of the first layer with hydroxyl radical (OH) solution by an anode current.

2. The method according to claim 1, wherein forming the first layer comprises performing a physical vapor deposition process or an atomic layer deposition process.

3. The method according to claim 1, wherein the first layer is formed to a thickness in a range of 100 Å to 800 Å.

4. The method according to claim 1, wherein the second layer has a thickness in a range of 50 Å to 200 Å.

5. The method according to claim 1, wherein the anode current has an intensity in a range of 0.5 A to 2 A.

6. The method according to claim 1, wherein forming the copper layer comprises performing an electro-chemical plating process.

7. The method according to claim 1, wherein forming the metal line comprises performing a chemical mechanical polishing process.

* * * * *